United States Patent
Alur et al.

(10) Patent No.: US 10,020,262 B2
(45) Date of Patent: Jul. 10, 2018

(54) HIGH RESOLUTION SOLDER RESIST MATERIAL FOR SILICON BRIDGE APPLICATION

(71) Applicant: Intel Corporation, Santa Clara, CA (US)

(72) Inventors: Siddharth K. Alur, Chandler, AZ (US); Sheng Li, Gilbert, AZ (US); Wei-Lun K. Jen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/199,219

(22) Filed: Jun. 30, 2016

(65) Prior Publication Data

US 2018/0005946 A1 Jan. 4, 2018

(51) Int. Cl.
*H01L 23/538* (2006.01)
*H01L 21/027* (2006.01)
(Continued)

(52) U.S. Cl.
CPC ...... *H01L 23/5384* (2013.01); *H01L 21/0274* (2013.01); *H01L 23/5381* (2013.01); *H01L 25/0652* (2013.01); *H01L 25/50* (2013.01)

(58) Field of Classification Search
None
See application file for complete search history.

(56) References Cited

U.S. PATENT DOCUMENTS

| 2007/0072095 A1 | 3/2007 | Ko et al. |
| 2007/0262051 A1 | 11/2007 | Yang et al. |

(Continued)

FOREIGN PATENT DOCUMENTS

KR 10-0643684 11/2006

OTHER PUBLICATIONS

Okada, et al., "Development of Photosensitive Solder Resist with High Reliability for Semiconductor Package", "Development of photosensitive solder resist with high reliability for semiconductor package," 2015 IEEE 65th Electronic Components and Technology Conference (ECTC), San Diego, CA, 2015, pp. 367-372.
(Continued)

*Primary Examiner* — Alexander Ghyka
(74) *Attorney, Agent, or Firm* — Schwabe, Williamson & Wyatt, P.C.

(57) ABSTRACT

In accordance with disclosed embodiments, there are provided high resolution solder resist material for silicon bridge application. For instance, in accordance with one embodiment, there is a silicon bridge disclosed, the silicon bridge having therein a solder resist layer formed from a high resolution solder resist material; in which the solder resist layer includes a polymer material which hardens when exposed to light radiation; in which the solder resist layer further includes spherical particles; a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further in which each of the smaller vias are less than half the size of any one of the larger vias; in which the larger vias and the smaller vias provide through-silicon vias (TSVs) interconnects through the solder resist layer electrically interfacing two or more functional semiconductor devices affixed to the silicon bridge; and the silicon bridge further having therein a copper layer positioned below the solder resist layer. Other related embodiments are disclosed.

18 Claims, 8 Drawing Sheets

(51) Int. Cl.
*H01L 25/065* (2006.01)
*H01L 25/00* (2006.01)

(56) References Cited

U.S. PATENT DOCUMENTS

| | | | |
|---|---|---|---|
| 2010/0213623 A1* | 8/2010 | Isshiki | B29C 43/18 |
| | | | 257/791 |
| 2011/0104867 A1 | 5/2011 | Feustel et al. | |
| 2012/0152600 A1* | 6/2012 | Nishioka | H05K 3/3452 |
| | | | 174/258 |
| 2014/0263172 A1 | 9/2014 | Xie et al. | |
| 2016/0141234 A1* | 5/2016 | We | H01L 23/5385 |
| | | | 361/767 |

OTHER PUBLICATIONS

International Search Report and Written Opinion from PCT/US2017/030888 dated Aug. 11, 2017, 11 pgs.

\* cited by examiner

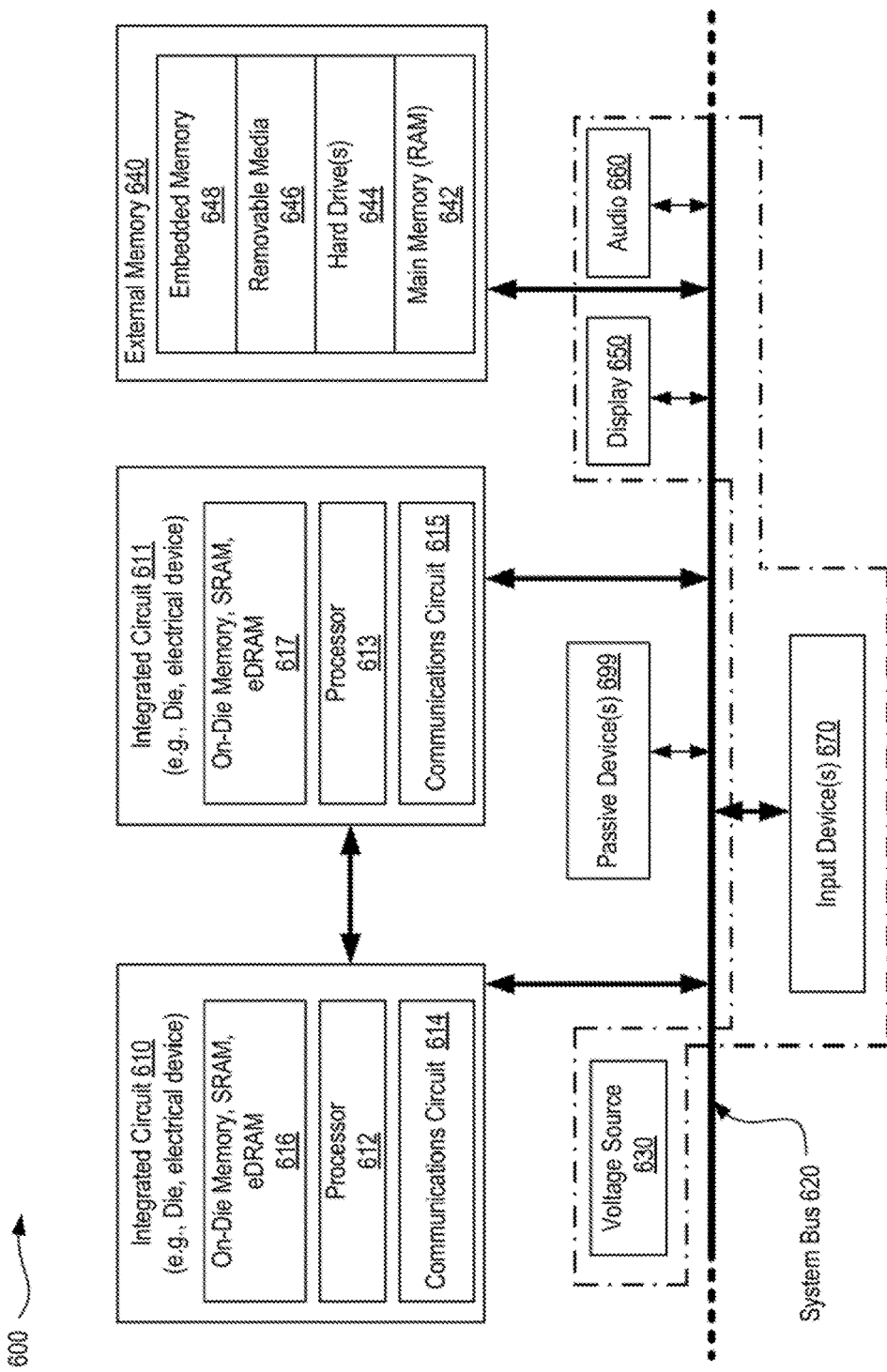

US 10,020,262 B2

HIGH RESOLUTION SOLDER RESIST MATERIAL FOR SILICON BRIDGE APPLICATION

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to implementing a high resolution solder resist material for silicon bridge applications.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

In semiconductor manufacturing, such as the manufacture of silicon bridge devices, there exists a need to create through-silicon vias (TSVs) through the substrate or other materials. So called "vias" are typically vertical electrical connections, hence the term "via" which pass completely through a silicon wafer or die. Use of such vias may be called upon as either an alternative to wire-bond and flip chip technologies or even supplement such technologies in the manufacturing of semiconductor devices including three-dimensional (3D) semiconductor packages, 3D integrated circuits, System on Chip (SoC) semiconductor devices, and related semiconductor components. Use of vias provides for a greater circuit density and additionally permits connections which are shorter in length.

Creation of such vias require the use of light which may scatter in an undesirable manner which reduces the accuracy attainable within the manufacturing processes.

The present state of the art may therefore benefit from implementing a high resolution solder resist material for silicon bridge applications as is described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 6 is a schematic of a computer system, in accordance with described embodiments.

DETAILED DESCRIPTION

Figure 1A:
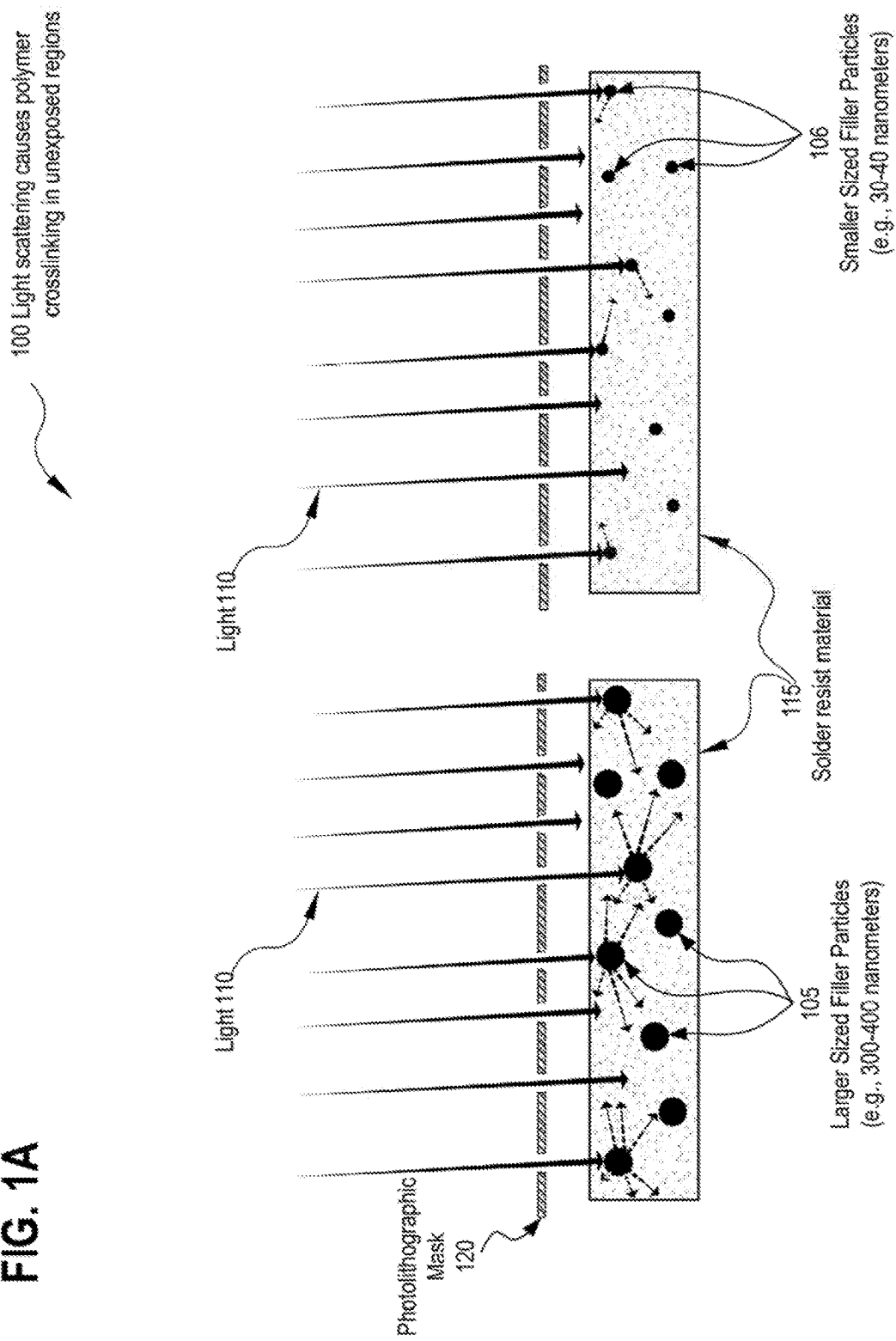
FIG. 1A depicts light applied via lithographic processes onto a solder resist material through a photolithographic mask in accordance with described embodiments.

Described herein are systems, methods, and apparatuses for implementing a high resolution solder resist material for silicon bridge applications in accordance with described embodiments. For instance, in accordance with one embodiment, there is a silicon bridge disclosed, the silicon bridge having therein a solder resist layer formed from a high resolution solder resist material; in which the solder resist layer includes a polymer material which hardens when exposed to light radiation; in which the solder resist layer further includes spherical particles; a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further in which each of the smaller vias are less than half the size of any one of the larger vias; in which the larger vias and the smaller vias provide through-silicon vias (TSVs) interconnects through the solder resist layer electrically interfacing two or more functional semiconductor devices affixed to the silicon bridge; and the silicon bridge further having therein a copper layer positioned below the solder resist layer.

The design and manufacture of silicon bridge semiconductor devices are of critical importance in modern computing. For instance, Intel Corporation's so called "Embedded Multi-die Interconnect Bridge" or simply "EMIB" represents an elegant and cost-effective approach to in-package high density interconnect of heterogeneous chips. For instance, rather than using a larger silicon interposer as is typical with other solutions, silicon bridge solutions utilize a very small bridge die, with multiple routing layers, which is then embedded into the resulting semiconductor device as part of the substrate fabrication process.

Modern semiconductor packaging techniques require a significant number of die-to-die connections and utilize silicon interposer and Through Silicon Vias (TSVs) techniques to provide die interconnects at high speeds within a minimal footprint. Such techniques result in increasingly complex semiconductor device layouts and manufacturing techniques which may lead to delayed tape-outs and depressed yield rates.

Use of the improved semiconductor bridge technologies such as those described herein provide practical, less complex, more reliable, and streamlined manufacturing solutions capable of implementation with a wide range of semiconductor devices. Moreover, there may be many embedded silicon bridges even within a single substrate, providing extremely high I/O and well controlled electrical interconnect paths between multiple die, as needed. Because the semiconductor chips need not be connected with a package higher performance is attainable.

According to the described embodiments, certain semiconductor devices require the creation of vias having least two different dimensions upon the same semiconductor device. For instance, such a semiconductor device may have larger vias within a first specified range and also smaller vias within a second specified vias. According to certain embodiments, the second vias of the smaller size are less than or equal to half the size of the larger vias.

Problematically, certain silicon bridge dies call for vias having a size dimension so small that conventional lithographic techniques are simply unable to yield the very small size dimensions. According to certain embodiments, therefore, the larger vias are opened lithographically using light and the smaller vias are opened utilizing laser.

However, use of both lithography and laser for opening vias of different size dimensions upon the same silicon bridge device introduces additional cost and complexity into the manufacturing process and therefore, it is advantageous to consolidate the processes for opening such vias into a single technique, such as using only lithography. Such an objective requires implementation of new techniques and materials not utilized with conventional silicon device manufacturing. For instance, Applicants describe herein means by which to lithographically open both larger and smaller vias upon a single silicon bridge device through the implementation of a high resolution solder resist material.

According to described embodiments, the smaller dimension vias are of such a small size that they simply cannot be opened by lithography techniques due to the inherent resolution capability of the material being limited to, for example, 45 nanometers. According to certain embodiments, the larger vias are of a size greater than the 45 nanometer limitation and the smaller vias are of a size lesser than the 45 nanometer limitation.

Although the use of UV laser does overcome this limit and has successfully been utilized to open the vias of the smaller sub-45 nanometer size, the use of such a technique necessitates unwanted cost and complexity.

Conventionally utilized solder resist materials utilize filler particles in the approximately 500 nanometer range which permits significant scattering of light when interacting with such filler particles. As described in further detail below, silica filler particles in the sub-100 nanometer range are utilized as filler particles in new solder resist materials to reduce light scattering from the incoming 365 nanometer wavelength light radiation and the 402 nanometer wavelength light radiation presently applied via lithographic processes.

Silica ($SiO_2$) and Barium Sulphate ($BaSO_4$) are both utilized as filler particles for the purpose of reducing Coefficient of Thermal Expansion (CTE) properties of the formed semiconductor device being fabricated.

Barium Sulphate is added as filler in addition to only using silica because the Barium Sulphate is less costly and additionally contributes to a reduction in CTE properties. While decreasing CTE, the filler particles have the undesirable effect of also reducing resolution and light transmission through the material because the wavelength of light used to photocure the material is close to the radius of the silica fillers themselves which causes scattering.

According to certain embodiments a second Barium Sulphate type filler particle is additionally used in the solder resist materials exposed lithographically but need not be replaced as the Barium Sulphate is entirely transparent to ultraviolet light and therefore does not cause the scattering observed from interaction of the light radiation with the silica type filler particles within the solder resist materials.

According to such embodiments, operations presently utilized to drill sub-45 nanometer vias into the solder resist material UV laser may be replaced with lithographic processes and therefore, but sub-45 nanometer vias and lager vias greater in size than 45 nanometers may both be opened via lithographic patterning on the same substrate material or within the same solder resist layer using lithographic processing along without the application of UV laser.

An alternative is to utilize new high-resolution photo imagable materials for the solder resist layer permitting greater accuracy via lithographic processing, however, replacement of the solder resist layer with high-resolution photo imagable materials necessitates additional re-optimization of the assembly process for interaction with flux and Ultrafiltration (UF) materials which in turn brings extreme re-tooling costs and fabrication delays.

Therefore, described herein are solutions for replacing only the filler particles with a smaller sized particle permitting the remainder of the polymer composition to remain the same and therefore obviating the need for re-optimization same.

Therefore, according to the described embodiments, the surface energy, chemical groups on the surface, polymer morphology and color of the material would be similar to the current solder resist material except to the extent such changes are proposed herein, such as a darkening of the solder resist material in accordance with certain described embodiments.

Reduced filler particle sizes has additionally been observed to yield improvements to the flow of the solder resist material. Moreover, utilizing of high-resolution photo imagable materials requires a dosage of 800-900 mJ for photocuring as compared to the proposed solder resist material described herein which requires a significantly lower dosage of 200-300 mJ this permitting further process improvement through reduced dosing requirements.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

FIG. 1A depicts light applied via lithographic processes onto a solder resist material 115 through a photolithographic mask 120 in accordance with described embodiments. In particular, it can be seen that there is light scattering 100 which causes polymer crosslinking in unexposed regions of the solder resist material 115. The light 110 is shone through the photolithography mask 120 to pattern the solder resist material 115 below, however, the light 110 problematically scatters during the lithographic process causing inaccuracies in the patterning of the solder resist material.

Depicted on the left image there is a greater extent of scattering of the light 110 throughout the solder resist material as the light scatters off of the 300-400 nanometer larger sized filler particles 105. On the right image, there is significantly less scattering of the light 110 due to the use of reinforcement particles of a much smaller size.

For instance, the smaller sized filler particles 106 depicted in the image on the right may have, according to described embodiments, a spherical shape and an average size of 30-40 nanometers in diameter. Due to the smaller size, there is significantly less scattering of the light 110 applied via the lithographic process and consequently, there is a more exact 1:1 correspondence between the patterning of the lithographic mask and the corresponding patterning of the solder resist material 115.

The photolithographic process exposes the solder resist material to light radiation which causes the material to harden in those areas exposed to the light radiation which passes through the photolithographic mask in a process known as patterning. It is this hardened portion of the solder resist material which actually remains on the substrate after subsequent operation which chemically remove the non-hardened portions of the solder resist material.

In such a way, it is possible to define features on the solder resist material. The photolithographic mask determines which portion of the solder resist material is exposed to the light radiation and which portion is not exposed to the light radiation. More particularly, the photolithographic mask actually blocks a portion of the light shone upon the mask preventing that light from reaching the surface of the solder resist material and causing it to harden. Unfortunately, some of the light which passes through the mask does not simply expose the desired portion of the solder resist material but will additionally scatter which then causes undesirable hardening of the solder resist material due to exposure to the light radiation in those areas reached by the scattering but which are not intended exposure areas according to the photolithographic mask design.

Ideally, the features designed into the photolithographic mask will translate on a 1:1 basis to exact and precisely identical features in the solder resist material after exposure and etch. However, due to the scattering of the light described above, some of the features will end up being larger than that which is intended, and thus, a precise 1:1 translation from the mask to the solder resist material is not attained. With larger feature sizes, the relative difference is small and thus, the divergence from the established mask features may be accommodated through design accommodations. However, as the features are reduced further and further in size, especially down to sizes in the sub-45 nanometer realm, the same divergence from the mask design causes a relatively larger discrepancy and thus exceeds design tolerances. Additionally, at these small scales, in the sub-45 nanometer realm, it is no longer possible to open sufficiently small vias due to the scattering when utilizing conventional materials and thus, alternative processing, such as UV laser exposure, is required to attain the requisite design dimension. This additional processing introduces not only added complexity but adds significant cost to fabrication and manufacture.

Figure 1B:
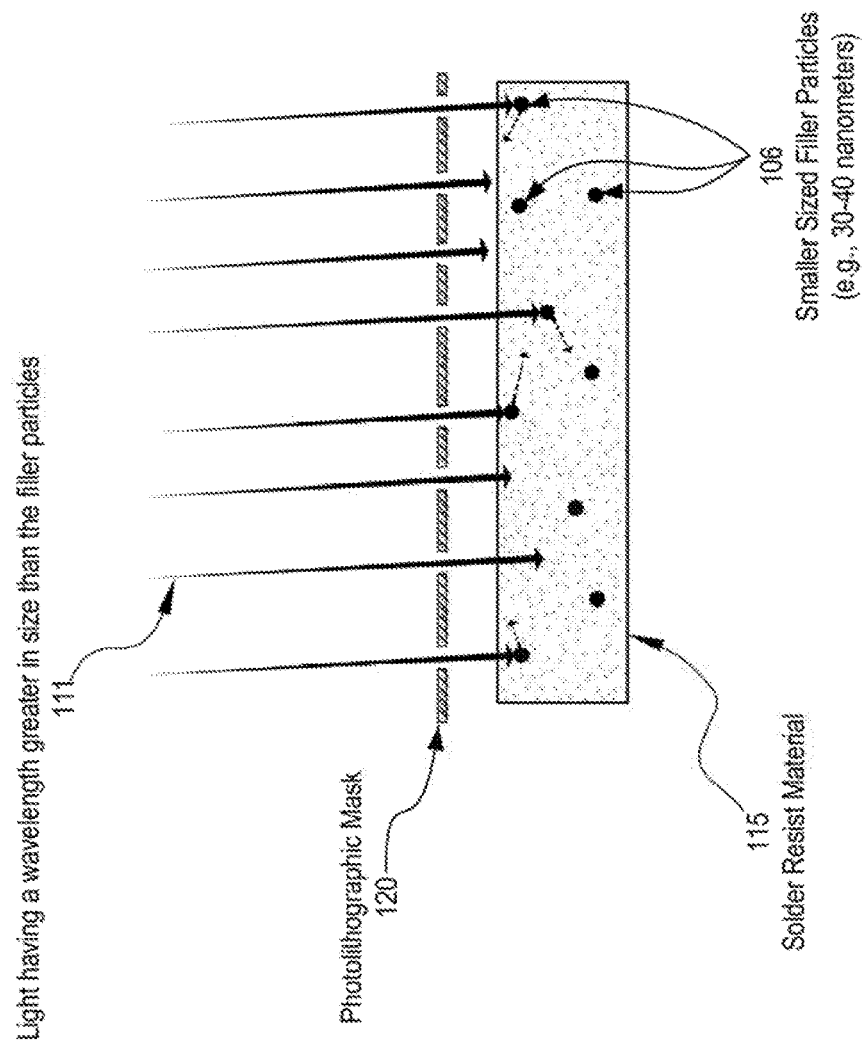
FIG. 1B depicts light applied via lithographic processes onto a solder resist material 115 through a photolithographic mask in accordance with described embodiments.

FIG. 1B depicts light 111 applied via lithographic processes onto a solder resist material 115 through a photolithographic mask 120 in accordance with described embodiments.

Conventional techniques utilizing lithographic processes to open vias operate in conjunction with a wide array of solder resist materials and from many different material suppliers. Such conventional solder resist materials, however, typically utilize fillers having an average size of 300 to 400 nanometers.

According to certain embodiments as described herein, the scattering of the light 111 is caused to be reduced by selecting a particle size which is smaller than the wavelength of the light 111 applied via the lithographic process. For instance, as is depicted here, the light 111 has a wavelength greater in size than the smaller sized filler particles 106 which are depicted as being spherical in shape with an average size in diameter of 30-40 nanometers. Other embodiments may select smaller sized filler particles than utilized in conventional solutions but larger than that which is depicted at FIG. 1B, such as smaller sized filler particles which are spherical in shape and having an average diameter of, for example, 30-60 nanometers, and in which the wavelength of the light 111 applied to the solder resist material through the photolithographic mask 120 is greater in size than the 30-60 nanometer sized filler particles. Stated differently, where filler particles of an average diameter of 30-60 nanometers is selected for the solder resist material, the light 111 shone onto the solder resist material through the photolithographic mask to pattern the solder resist material 115 is of a wavelength greater than 60 nanometers so as to attain a sufficiently minimized scattering of the light 111 and consequently attain a more exact match between the pattern of the photolithographic mask 120 and the patterned solder resist material.

According to a particular embodiment, filler particles which are spherical in shape and having an average diameter of 30-60 nanometers are utilized in conjunction with a light 111 having a wavelength greater than 60 nanometers to lithographically open vias in the solder resist material 115 which are smaller in size than the average size of the filler particles. For instance, according to a particular embodiment, there are both large and small vias opened in the solder resist material 115 via lithographic process in which the larger vias opened are of a size greater than the 30-60 nanometer average sized filler particles and in which the small vias opened are of a size less than the 30-60 nanometer average sized filler particles.

According to such an embodiment, both the larger and the smaller sized vias are opened in the same piece solder resist material 115 simultaneously via a single lithographic process without the use of a UV laser. Implementation of such an embodiment therefore eliminates an expensive process step and eliminates the costly application of UV laser to the solder resist material.

Reduction in the size of the filler particles results in a reduction in the amount of scattering light and consequently there is a significantly lesser degree of unwanted polymer crosslinking in the unexposed regions of the solder resist material. The reduction in scattering provides a significantly higher accuracy in the patterning and it is therefore possible to lithographically open vias in the solder resist material which are less than half the size in diameter of the larger vias conventionally opened via lithography process meaning that both large and small vias are attainable using lithography without having to result to UV laser processes.

Figure 2:
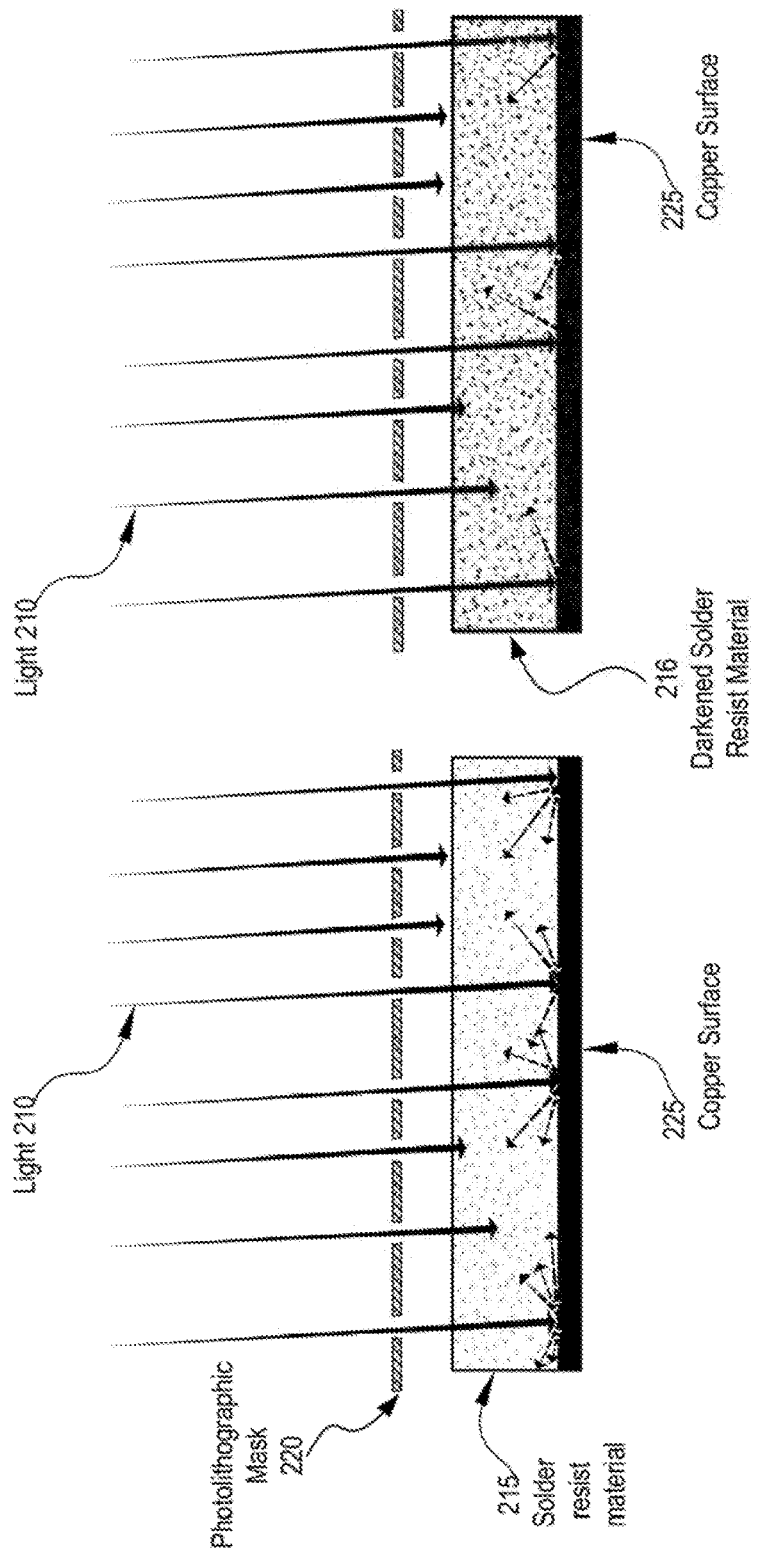
FIG. 2 depicts light applied via lithographic processes onto a solder resist material having a copper surface below through a photolithographic mask above in accordance with described embodiments.

FIG. 2 depicts light applied via lithographic processes onto a solder resist material 215 having a copper surface 225 below through a photolithographic mask 220 above in accordance with described embodiments.

The reflection of light off of the copper surface causes problems due to the scattering light radiation exposing or hardening unintended portions of the solder resist material. Making the solder resist material darker in color reduces the amount of light traversing through the material and consequently reduces the amount of light reflecting or scattering off of the copper surface. According to a particular embodiment, the color of the solder resist material is designed to be sufficiently dark that no light radiation scatters off of the copper surface.

As described above, scattering of the light 210 is reduced through the use of smaller filler particles, especially where the filler particles are of a smaller average size in diameter than the wavelength of the light 210 lithographically applied through the photolithographic mask 220.

As depicted by the image on the left, light 210 is lithographically applied through the photolithographic mask 220 onto the solder resist material below to pattern the solder resist material in accordance with the pattern of the mask. As is further depicted, the mask has a bottom copper surface 225 and a portion of the light 210 applied from above penetrates entirely through the solder resist material and then scatters, bounces, refracts, or reflects off of the top of the copper surface 225 below the solder resist material 215, resulting in unwanted exposure due to polymer crosslinking in unexposed regions of the solder resist material 215.

Depicted by the image on the right, light 210 is again lithographically applied through the photolithographic mask 220 onto the solder resist material below to pattern the solder resist material in accordance with the pattern of the mask, however, as depicted via the image on the right, darkened solder resist material 216 is utilized which still further reduces the scattering of light due and consequently improves accuracy of the patterning of the darkened solder resist material 216 by causing a reduction in the ability of the light to traverse through the material and then scatter off of the copper surface below.

According to such an embodiment, filler material is selected to result in the darkened solder resist material to negate the effects of the light scattering off of the bottom copper surface as will occur to a greater extent with lighter colored solder resist material 215, such as that depicted at the left image.

The darkened solder resist material 216 permits less transmission of the light 210 through to the bottom copper surface 225 and therefore less scatter occurs.

It is in accordance with one embodiment therefore that a UV laser operation for opening the smaller of two size dimensions of vias upon a single silicon device is eliminated and both larger and smaller vias are opened within the same silicon device via application of a lithographic process without the use of UV laser.

Figure 3:
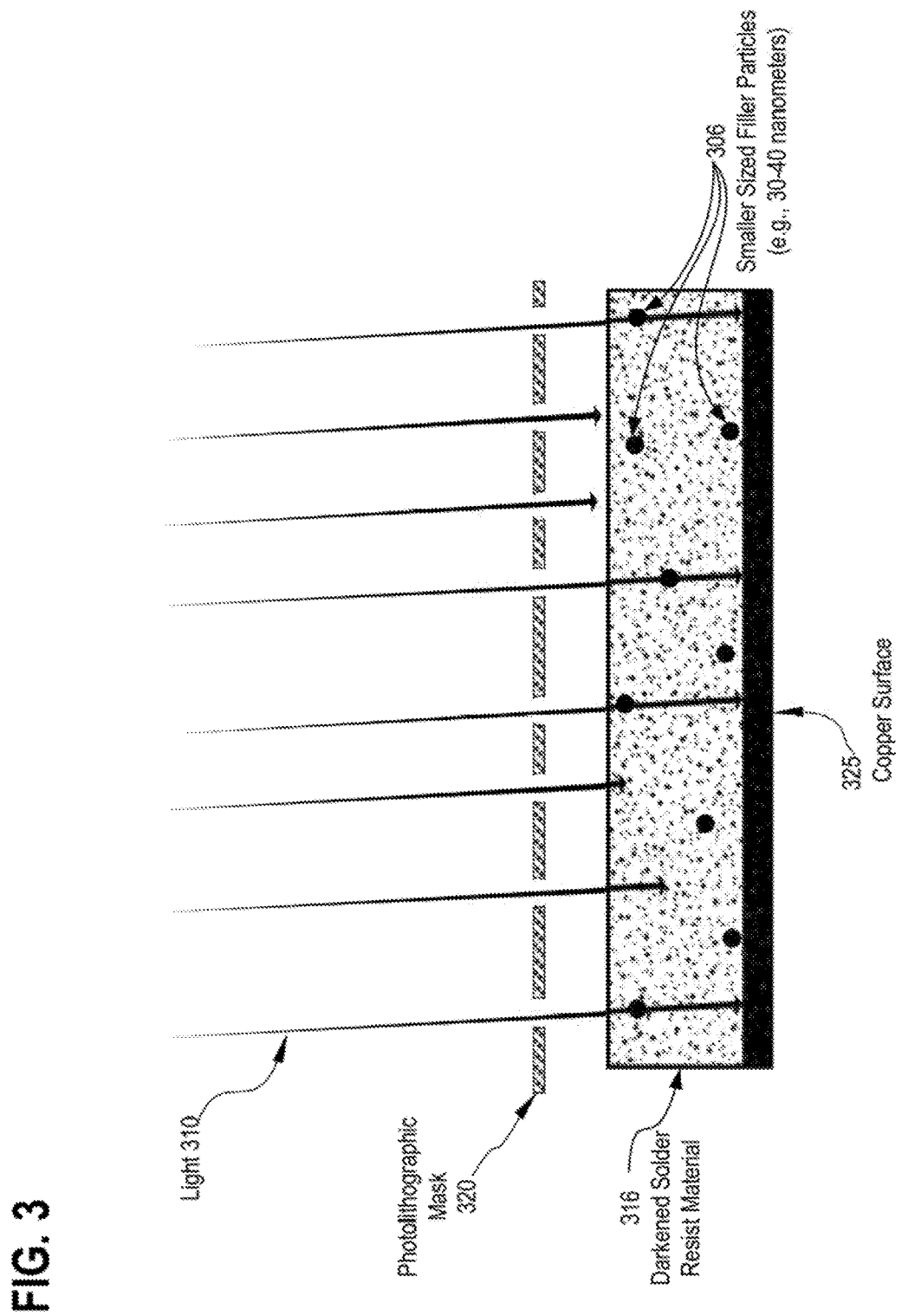
FIG. 3 depicts light applied via lithographic processes onto a darkened solder resist material having a copper surface below through a photolithographic mask above in accordance with described embodiments.

FIG. 3 depicts light 310 applied via lithographic processes onto a darkened solder resist material 316 having a copper surface 325 below through a photolithographic mask 320 above in accordance with described embodiments. As is depicted here, there are smaller sized filler particles 306 utilized in accordance with described embodiments. For instance, the smaller sized filler particles 306 may constitute spherical shaped particles having an average size of 30-40 nanometers or alternatively an average size of 30-60 nanometers or alternatively an average size of 40-60 nanometers, or alternatively a different average particle size which is in between the size of the larger and the smaller vias opened into the solder resist material and further in which the average size of the particles is less than the wavelength of the light 310 applied via the lithographic process through the photolithographic mask 320.

In such a way, the benefits of the smaller particle sizes in reducing the scattering of light are combined with the benefits of the darkened filler material 316 in reducing the scattering of light to greatly enhance the accuracy of the photolithographic process such that sub-45 nanometer sized vias may be opened into the darkened solder resist material 316.

Figure 4A:
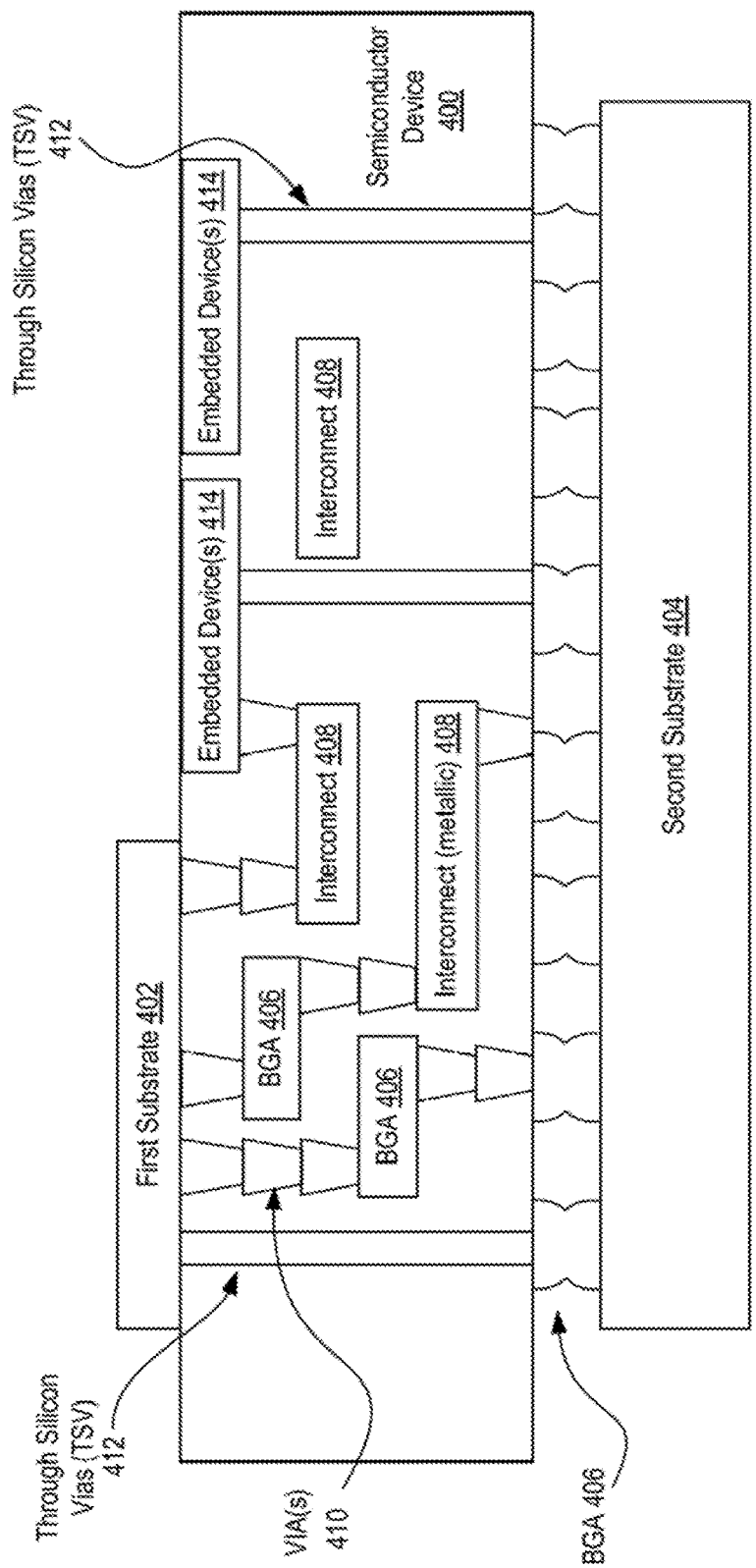
FIG. 4A illustrates semiconductor device such as a silicon bridge or an interposer having vias opened therein and which includes one or more of the described embodiments.

FIG. 4A illustrates semiconductor device 400 such as a silicon bridge or an interposer having vias opened therein and which includes one or more of the described embodiments. The semiconductor device 400 may operate as a silicon bridge capable of providing interconnectivity between a first substrate 402 to a second substrate 404. The first substrate 402 may be, for instance, an integrated circuit die. The second substrate 404 may be, for instance, a memory module, a computer motherboard, or another integrated circuit die. Generally, the purpose of such a semiconductor device 400 is to spread a connection to a wider pitch or to reroute a connection to a different connection. For example, semiconductor device 400 may couple an integrated circuit die to a ball grid array (BGA) 406 that can subsequently be coupled to the second substrate 404. In some embodiments, the first and second substrates 402/404 are attached to opposing sides of the semiconductor device 400. In other embodiments, the first and second substrates 402/404 are attached to the same side of the semiconductor device 400. And in further embodiments, three or more substrates are interconnected by way of the semiconductor device 400 when configured as an intermediate interposer.

The a semiconductor device 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The semiconductor device 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the semiconductor device 400. In accordance with described embodiments, apparatuses or processes disclosed herein may be used in the fabrication of a semiconductor device 400.

Figure 4B:
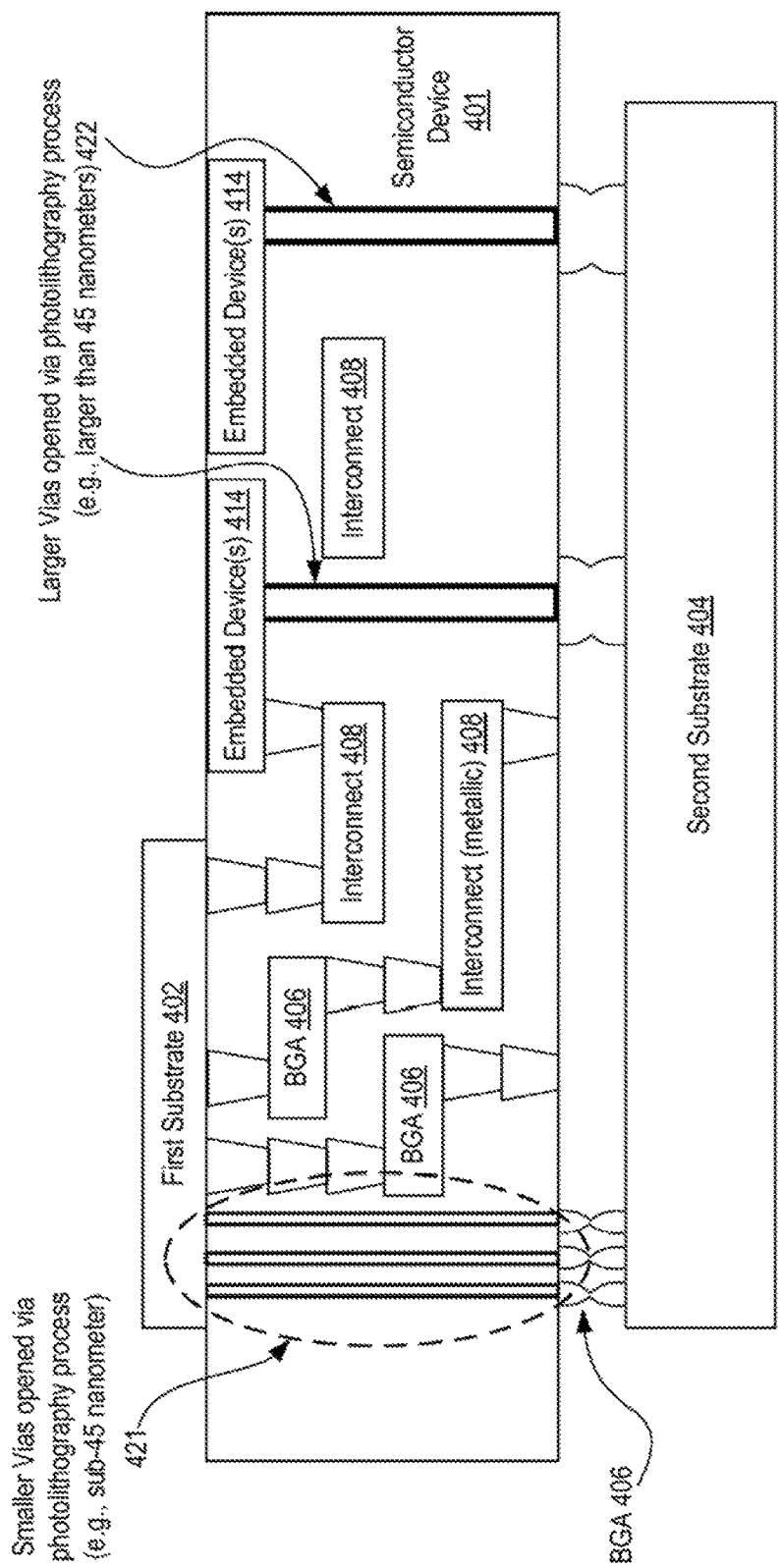
FIG. 4B illustrates semiconductor device such as a silicon bridge or an interposer having vias opened therein and which includes one or more of the described embodiments.

FIG. 4B illustrates semiconductor device 401 such as a silicon bridge or an interposer having vias opened therein and which includes one or more of the described embodiments. As before, the semiconductor device 401 may operate as a silicon bridge in accordance with the described embodiments. Here there are depicted vias of at least two different size dimensions. Specifically, on the left there are smaller vias 421 opened via photolithography process in which the smaller vias are of a size dimension in the sub-45 nanometer range. Depicted on the right are multiple larger vias 422 opened via photolithography process in which the larger vias are of a size dimension grater than 45 nanometers. According to the depicted embodiment, the smaller vias 421 are less than half of the size in diameter of the larger vias 422. Further still, in accordance with the described embodiment, both the larger vias 422 and the smaller vias 421 are opened within the same semiconductor device 401 via lithographic process without the application of UV laser to a solder resist material within which the vias are opened.

Figure 5:
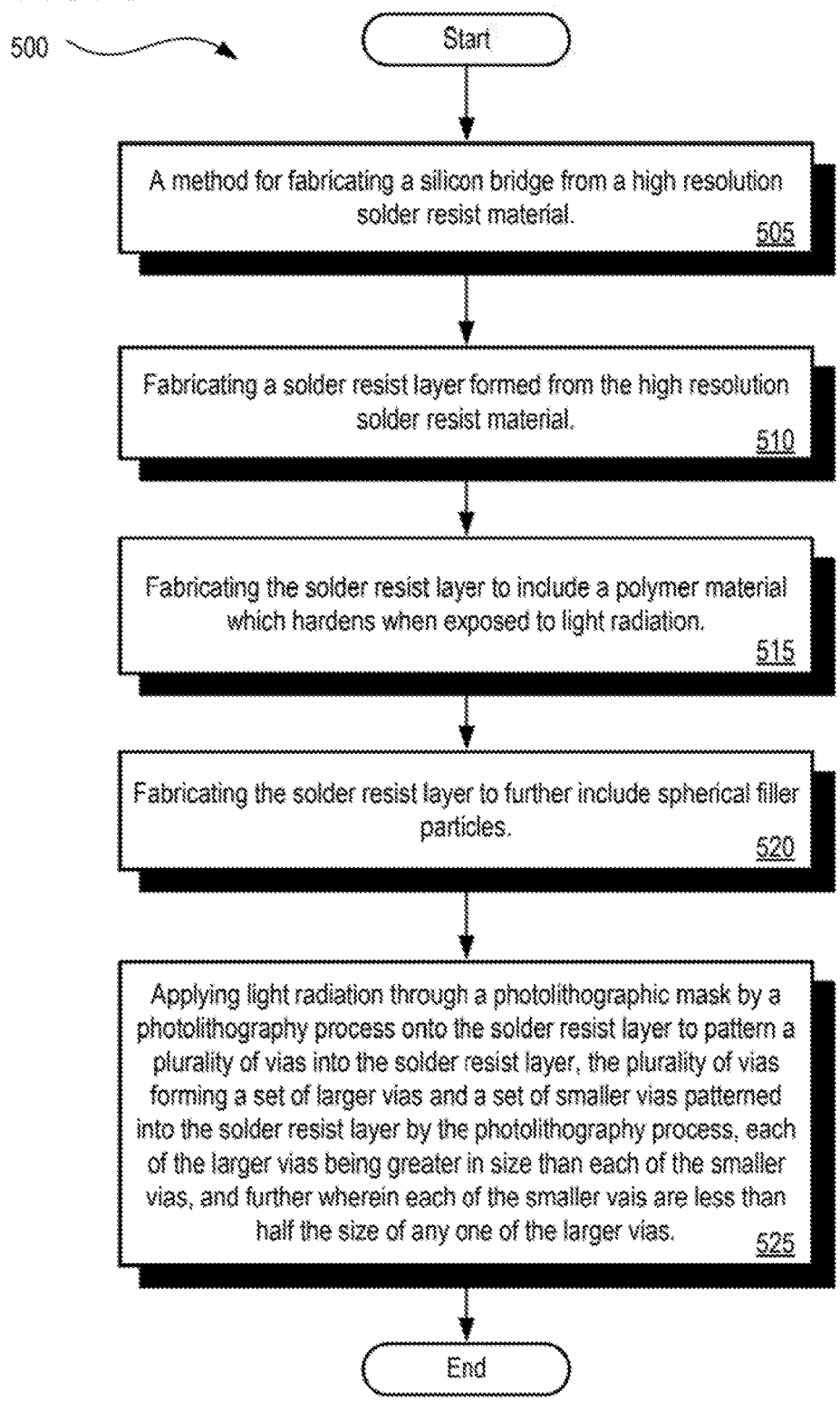
FIG. 5 is a flow diagram illustrating a method for implementing a high resolution solder resist material for silicon bridge applications in accordance with described embodiments.

FIG. 5 is a flow diagram illustrating a method 500 for implementing a high resolution solder resist material for silicon bridge applications in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 500 may be utilized in a variety of combinations.

The method 500 begins with block 505 for fabricating a silicon bridge from a high resolution solder resist material.

At block 510 the method includes fabricating a solder resist layer formed from the high resolution solder resist material.

At block 515 the method includes fabricating the solder resist layer to include a polymer material which hardens when exposed to light radiation.

At block 520 the method includes fabricating the solder resist layer to further include spherical filler particles.

At block 525 the method includes applying light radiation through a photolithographic mask by a photolithography process onto the solder resist layer to pattern a plurality of vias into the solder resist layer, the plurality of vias forming a set of larger vias and a set of smaller vias patterned into the solder resist layer by the photolithography process, each of the larger vias being greater in size than each of the smaller vias, and further wherein each of the smaller vias are less than half the size of any one of the larger vias.

FIG. 6 is a schematic of a computer system 600, in accordance with described embodiments. The computer system 600 (also referred to as the electronic system 600) as depicted can embody a high resolution solder resist material for silicon bridge applications, according to any of the several disclosed embodiments and their equivalents as set forth in this disclosure. The computer system 600 may be a mobile device such as a net-book computer. The computer system 600 may be a mobile device such as a wireless smart phone or tablet. The computer system 600 may be a desktop computer. The computer system 600 may be a hand-held reader. The computer system 600 may be a server system. The computer system 600 may be a supercomputer or high-performance computing system.

In accordance with one embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

Such an integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes, or is coupled with, electrical devices having a high resolution solder resist material for silicon bridge applications, as disclosed herein.

In accordance with one embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In accordance with one embodiment, the integrated circuit 610 is complemented with a subsequent integrated circuit 611. Useful embodiments include a dual processor 613 and a dual communications circuit 615 and dual on-die memory 617 such as SRAM. In accordance with one embodiment, the dual integrated circuit 610 includes embedded on-die memory 617 such as eDRAM.

In one embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

In accordance with one embodiment, the electronic system 600 also includes a display device 650 and an audio output 660. In one embodiment, the electronic system 600 includes an input device 670 such as a controller that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a package substrate having a high resolution solder resist material for silicon bridge applications, according to any of the several disclosed embodiments and their equivalents, an electronic system, a computer system, one or more methods of fabricating an integrated circuit, and one or more methods of fabricating an electronic assembly that includes a package substrate having a high resolution solder resist material for silicon bridge applications, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a high resolution solder resist material for silicon bridge applications embodiments and their equivalents. A foundation substrate 698 may be included, as represented by the dashed line of FIG. 6. Passive devices 699 may also be included, as is also depicted in FIG. 6.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is an apparatus to implement a high resolution solder resist material for silicon bridge applications, the apparatus comprising: a substrate package including: a solder resist layer; in which the solder resist layer includes a polymer material which hardens when exposed to light radiation; in which the solder resist layer further includes spherical particles; a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further in which each of the smaller vias are less than half the size of any one of the larger vias; and a pigment added to the solder resist layer to darken the solder resist layer from its original color.

According to another embodiment, each of the larger vias are greater than 45-nanometers diameter; and in which each of the smaller vias are smaller than 45-nanometers in diameter.

According to another embodiment, both the smaller vias which are smaller than 45-nanometers in diameter and the larger vias which are greater than 45-nanometers in diameter are opened in the solder resist layer utilizing the photolithography process without subjecting the solder resist layer to application of a UV laser process.

According to another embodiment, the larger vias are greater in size than an average diameter of the spherical particles of the solder resist layer; and in which the smaller vias are smaller in size than the average diameter of the spherical particles of the solder resist layer.

According to another embodiment, the photolithography process includes the application of the light radiation onto the solder resist layer through a photolithographic mask above the solder resist layer; and in which the spherical particles of the solder resist layer have an average diameter which is smaller than a wavelength of the light radiation applied via the photolithographic process.

According to another embodiment, the spherical particles of the solder resist layer includes Silica (SiO2) which reduces a Coefficient of Thermal Expansion (CTE) of the formed substrate package.

According to another embodiment, the solder resist layer further includes a second type of filler particles, the second of filler particles including Barium Sulphate (BaS04) which reduces the Coefficient of Thermal Expansion (CTE) of the formed substrate package in conjunction with the Silica (SiO2) spherical particles of the solder resist layer.

According to another embodiment, the pigment is green in color.

According to another embodiment, the apparatus further includes a copper layer; in which the copper layer is positioned below the solder resist layer.

According to another embodiment, the photolithography process includes the application of light radiation onto the solder resist layer through a photolithographic mask above the solder resist layer; and in which the pigment added to the solder resist layer prevents some or all of the light radiation applied via the photolithography process from reaching a copper layer at a bottom surface of the solder resist layer.

According to another embodiment, the photolithography process includes the application of light radiation onto the solder resist layer through a photolithographic mask above the solder resist layer; and in which the pigment added to the solder resist layer reduces or eliminates the light radiation from scattering off of a copper layer at a bottom surface of the solder resist layer and reduces or eliminates crosslinking of polymers in the solder resist material in areas which do not correspond to a patterning of the photolithographic mask.

According to another embodiment, the apparatus further includes a functional semiconductor device positioned on a top surface of the solder resist layer.

According to another embodiment, the substrate package is embodied within a three-dimensional (3D) integrated circuit package; and in which the larger vias and the smaller vias provide through-silicon vias (TSVs) interconnects through the solder resist layer electrically interfacing two or more functional semiconductor devices.

According to another embodiment, the substrate package is embodied within a System on Chip (SoC) semiconductor device; and in which the larger vias and the smaller vias provide vertical interconnects traversing entirely through the solder resist layer, in which the vertical interconnects electrically interface two or more functional semiconductor devices forming sub-components of the SoC semiconductor device.

According to another embodiment, there is a silicon bridge.

It is therefore in accordance with one of the described embodiments that such a silicon bridge includes: a solder resist layer formed from a high resolution solder resist material; in which the solder resist layer includes a polymer material which hardens when exposed to light radiation; in which the solder resist layer further includes spherical particles; a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further in which each of the smaller vias are less than half the size of any one of the larger vias; in which the larger vias and the smaller vias provide through-silicon vias (TSVs) interconnects through the solder resist layer electrically interfacing two or more functional semiconductor devices affixed to the silicon bridge; and a copper layer positioned below the solder resist layer.

According to another embodiment, such a silicon bridge includes a pigment added to the solder resist layer to darken the solder resist layer from its original color.

According to another embodiment, each of the larger vias are greater than 45-nanometers in diameter; and in which each of the smaller vias are smaller than 45-nanometers in diameter.

According to another embodiment, both the smaller vias which are smaller than 45-nanometers in diameter and the larger vias which are greater than 45-nanometers in diameter are opened in the solder resist layer utilizing the photolithography process without subjecting the solder resist layer to application of a UV laser process.

According to another embodiment, the larger vias are greater in size than an average diameter of the spherical particles of the solder resist layer; and in which the smaller vias are smaller in size than the average diameter of the spherical particles of the solder resist layer.

According to another embodiment, the photolithography process includes the application of the light radiation onto the solder resist layer through a photolithographic mask above the solder resist layer; and in which the spherical particles of the solder resist layer have an average diameter which is smaller than a wavelength of the light radiation applied via the photolithographic process.

In accordance with one described embodiment, there disclosed a method for fabricating a silicon bridge from a high resolution solder resist material.

Such a method therefore includes: fabricating a solder resist layer formed from the high resolution solder resist material; in which the solder resist layer includes a polymer material which hardens when exposed to light radiation; in which the solder resist layer further includes spherical particles; applying light radiation through a photolithographic mask by a photolithography process onto the solder resist layer to pattern a plurality of vias into the solder resist layer, the plurality of vias forming a set of larger vias and a set of smaller vias patterned into the solder resist layer by the photolithography process, each of the larger vias being greater in size than each of the smaller vias, and further in which each of the smaller vias are less than half the size of any one of the larger vias; in which the larger vias and the smaller vias provide through-silicon vias (TSVs) interconnects through the solder resist layer electrically interfacing two or more functional semiconductor devices affixed to the silicon bridge.

According to another embodiment, the method further includes dying the high resolution solder resist material with a pigment to darken the high resolution solder resist material from its original color.

According to another embodiment, fabricating solder resist layer includes fabricating the solder resist layer atop a copper layer which is positioned below the solder resist layer subsequent to fabrication of the solder resist layer.

According to another embodiment, the method further includes connecting two or more functional semiconductor devices affixed to the silicon bridge, in which the two or more functional semiconductor devices are connected via electrical interfaces through the larger vias and the smaller vias which provide through-silicon vias (TSVs) interconnects through the solder resist layer.

According to another embodiment, applying light radiation through a photolithographic mask by a photolithography process onto the solder resist layer to pattern a plurality of vias into the solder resist layer includes applying the light radiation having a wavelength which is smaller than the larger vias and larger than the smaller vias.

Also described herein is a system which implements a silicon bridge from a high resolution solder resist material.

It is therefore in accordance with one described embodiment that such a system includes: a processor and a memory to execute instructions; a printed circuit board (PCB) motherboard having the processor and the memory mounted thereupon; and a silicon bridge mounted to the PCB motherboard, the silicon bridge including: (i) a solder resist layer formed from a high resolution solder resist material, in which the solder resist layer includes a polymer material which hardens when exposed to light radiation and in which the solder resist layer further includes spherical particles; (ii) a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further in which each of the smaller vias are less than half the size of any one of the larger vias, in which the larger vias and the smaller vias provide through-silicon vias (TSVs) interconnects through the solder resist layer electrically interfacing two or more functional semiconductor devices affixed to the silicon bridge; and (ii) a copper layer positioned below the solder resist layer.

According to another embodiment, the system is embodied within one of: a smart phone; a tablet; a hand-held computing device; a personal computer; or a wearable technology to be worn as a clothing item or an accessory.

According to another embodiment, a functional semiconductor die is affixed to a top surface of the silicon bridge; and in which the functional semiconductor die includes a Central Processing Unit (CPU).

What is claimed is:

1. A substrate package comprising;
a solder resist layer;
wherein the solder resist layer comprises a polymer material which hardens when exposed to light radiation;
wherein the solder resist layer further comprises spherical particles;
a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further wherein each of the smaller vias are less than half the size of any one of the larger vias, wherein the larger vias are greater in size than an average diameter of the spherical particles of the solder resist layer, and wherein the smaller vias are smaller in size than the average diameter of the spherical particles of the solder resist layer; and
a pigment added to the solder resist layer to darken the solder resist layer from its original color.

2. The substrate package of claim 1:
wherein each of the larger vias are greater than 45-nanometers in diameter; and
wherein each of the smaller vias are smaller than 45-nanometers in diameter.

3. The substrate package of claim 2:
wherein both the smaller vias which are smaller than 45-nanometers in diameter and the larger vias which are greater than 45-nanometers in diameter are opened in the solder resist layer utilizing the photolithography process without subjecting the solder resist layer to application of a UV laser process.

4. The substrate package of claim 1:
wherein the photolithography process includes the application of the light radiation onto the solder resist layer through a photolithographic mask above the solder resist layer; and
wherein the spherical particles of the solder resist layer have an average diameter which is smaller than a wavelength of the light radiation applied via the photolithographic process.

5. The substrate package of claim 1, wherein the spherical particles of the solder resist layer comprises Silica (SiO2) which reduces a Coefficient of Thermal Expansion (CTE) of the formed substrate package; and wherein the solder resist layer further comprises a second type of filler particles, the second of filler particles comprising Barium Sulphate (BaSO4) which reduces the Coefficient of Thermal Expansion (CTE) of the formed substrate package in conjunction with the Silica (SiO2) spherical particles of the solder resist layer.

6. The substrate package of claim 1:
wherein the pigment is green in color.

7. The substrate package of claim 1:
wherein the photolithography process includes the application of light radiation onto the solder resist layer through a photolithographic mask above the solder resist layer; and
wherein the pigment added to the solder resist layer prevents some or all of the light radiation applied via the photolithography process from reaching a copper layer at a bottom surface of the solder resist layer.

8. The substrate package of claim 1:
wherein the photolithography process includes the application of light radiation onto the solder resist layer through a photolithographic mask above the solder resist layer; and
wherein the pigment added to the solder resist layer reduces or eliminates the light radiation from scattering off of a copper layer at a bottom surface of the solder resist layer and reduces or eliminates crosslinking of polymers in the solder resist material in areas which do not correspond to a patterning of the photolithographic mask.

9. The substrate package of claim 1, further comprising:
a functional semiconductor device positioned on a top surface of the solder resist layer.

10. The substrate package of claim 1:
wherein the substrate package is embodied within a three-dimensional (3D) integrated circuit package; and
wherein the larger vias and the smaller vias provide through-silicon vias (TSVs) interconnects through the solder resist layer electrically interfacing two or more functional semiconductor devices.

11. The substrate package of claim 1:
wherein the substrate package is embodied within a System on Chip (SoC) semiconductor device; and
wherein the larger vias and the smaller vias provide vertical interconnects traversing entirely through the solder resist layer, wherein the vertical interconnects electrically interface two or more functional semiconductor devices forming sub-components of the SoC semiconductor device.

12. A silicon bridge comprising:
a solder resist layer formed from a high resolution solder resist material;
wherein the solder resist layer comprises a polymer material which hardens when exposed to light radiation;
wherein the solder resist layer further comprises spherical particles;
a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further wherein each of the smaller vias are less than half the size of any one of the larger vias; wherein the larger vias and the smaller vias provide through-silicon vias (TSVs) interconnects through the solder resist layer electrically interfacing two or more functional semiconductor devices affixed to the silicon bridge, wherein the larger vias are greater in size than an average diameter of the spherical particles of the solder resist layer, and wherein the smaller vias are smaller in size than the average diameter of the spherical particles of the solder resist layer;
a copper layer positioned below the solder resist layer; and
a pigment added to the solder resist layer to darken the solder resist layer from its original color.

13. The silicon bridge of claim 12:
wherein each of the larger vias are greater than 45-nanometers in diameter; and
wherein each of the smaller vias are smaller than 45-nanometers in diameter.

14. The silicon bridge of claim 13:
wherein both the smaller vias which are smaller than 45-nanometers in diameter and the larger vias which are greater than 45-nanometers in diameter are opened in the solder resist layer utilizing the photolithography process without subjecting the solder resist layer to application of a UV laser process.

15. The silicon bridge of claim 11:
wherein the photolithography process includes the application of the light radiation onto the solder resist layer through a photolithographic mask above the solder resist layer; and
wherein the spherical particles of the solder resist layer have an average diameter which is smaller than a wavelength of the light radiation applied via the photolithographic process.

16. A system to implement a silicon bridge from a high resolution solder resist material, the system comprising:
a processor and a memory to execute instructions;
a printed circuit board (PCB) motherboard having the processor and the memory mounted thereupon; and
a silicon bridge mounted to the PCB motherboard, the silicon bridge comprising:
(i) a solder resist layer formed from a high resolution solder resist material, wherein the solder resist layer comprises a polymer material which hardens when exposed to light radiation and wherein the solder resist layer further comprises spherical particles;
(ii) a plurality of vias patterned into the solder resist layer by a photolithography process, the plurality of vias forming a set of larger vias and a set of smaller vias patterned into the solder resist layer by the photolithography process, each of the larger vias being greater in size than each of the smaller vias, and further wherein each of the smaller vias are less than half the size of any one of the larger vias, wherein the larger vias and the smaller vias provide through-silicon vias (TSVs) interconnects through the solder resist layer electrically interfacing two or more functional semiconductor devices affixed to the silicon bridge, wherein the larger vias are greater in size than an average diameter of the spherical particles of the solder resist layer, and wherein the smaller vias are smaller in size than the average diameter of the spherical particles of the solder resist layer; and (iii) a copper layer positioned below the solder resist layer.

17. The system of claim 16, wherein the system is embodied within one of: a smart phone; a tablet; a hand-held computing device; a personal computer; or a wearable technology to be worn as a clothing item or an accessory.

18. The system of claim 16, wherein a functional semiconductor die is affixed to a top surface of the silicon bridge; and wherein the functional semiconductor die comprises a Central Processing Unit (CPU).

* * * * *